United States Patent [19]

Tsukagoshi et al.

[11] Patent Number: 4,622,097
[45] Date of Patent: Nov. 11, 1986

[54] PROCESS FOR PRODUCING COPPER THROUGH-HOLE PRINTED CIRCUIT BOARD

[75] Inventors: Minoru Tsukagoshi; Takuo Nakayama, both of Kawagoe; Masahiko Minagawa, Asaka; Shuji Yoshida, Kawagoe, all of Japan

[73] Assignee: Shikoku Chemicals Corporation, Kagawa, Japan

[21] Appl. No.: 784,751

[22] Filed: Oct. 7, 1985

[30] Foreign Application Priority Data

Oct. 11, 1984 [JP] Japan ................................ 59-213304

[51] Int. Cl.$^4$ ........................... C23F 1/02; B44C 1/22; C03C 15/00; C03C 25/06
[52] U.S. Cl. ............................... 156/644; 156/630; 156/634; 156/659.1; 156/902; 156/904; 156/666
[58] Field of Search ................. 427/97; 29/846, 852; 156/630, 634, 644, 656, 659.1, 902, 904, 666; 252/79.5; 178/68.5

[56] References Cited

U.S. PATENT DOCUMENTS 4,389,278  6/1983  Kai ........................................ 156/630
4,529,477  7/1985  Lundberg et al. ................. 156/659.1

Primary Examiner—William A. Powell
Attorney, Agent, or Firm—Sherman and Shalloway

[57] ABSTRACT

Disclosed is a process for producing a copper through-hole printed circuit board, which comprises forming a required pattern on a copper-clad laminated plate using a resist ink soluble in an alkaline aqueous solution, immersing the copper-clad laminated plate in an aqueous solution of a salt of an alkylimidazole compound represented by the following general formula

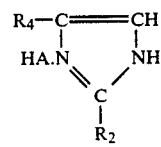

wherein $R_2$ represents an alkyl group having 5 to 21 carbon atoms, $R_4$ represents a hydrogen atom or a methyl group, and HA represents an organic or inorganic acid, to form on the copper surface of the copper-clad laminated plate an etching resist film composed of the alkylimidazole compound, drying the resulting copper-clad laminated plate, and then treating it with an alkaline etching solution.

3 Claims, No Drawings

PROCESS FOR PRODUCING COPPER THROUGH-HOLE PRINTED CIRCUIT BOARD

BACKGROUND OF THE INVENTION

1. Field of the Invention

This invention relates to a process for producing a printed circuit board. More specifically, it relates to a process for producing a copper through-hole printed circuit board characterized in that an organic compound containing in the molecule both a long hydrophobic group portion and a polar group portion having strong affinity for copper metal is coated as an etching resist instead of applying electrolytic solder plating as in the prior art.

In the production of a copper through-hole printed circuit board, it is necessary to print a circuit accurately on both surfaces of the circuit board and connect the circuits on both surfaces accurately at many required parts. The present invention provides a process for producing a copper through-hole printed circuit board having high reliability at low cost within a short period of time.

2. Detailed of the Prior Art

A method known as the hole-filling method has gained most widespread use in the past for the production of copper through-hole printed circuit boards. It comprises providing many holes at required parts of a laminated plate copper-clad on both surfaces, treating the resulting base board having many holes with a catalyst, subjecting it to copper electroless plating, then subjecting it to copper electroplating to form a copper coating throughout the base board including the holes, thereafter filling a hole-filling ink into all the holes to prevent entry of an etching solution and protect the copper coating in the holes, printing an etching resist through a positive so as to give required circuits to both surfaces of the base board, and thereafter etching the base board to remove the copper from the unwanted exposed parts while leaving those parts which are protected by the etching resist and the hole-filling ink. As a result, a copper through-hole printed circuit board is formed.

According to this hole-filling method, the hole-filling ink may shrink during the process by reason of evaporation of the solvent from the ink, for example, so that the etching solution is likely to get into the holes and dissolve the copper coating. Furthermore, as a result of this shrinking, the thickness of the hole-filling ink layer tends to become smaller than the thickness of the printed circuit board. For this reason, it is very likely that the copper coating at edge parts between the base board and the holes being dissolved (defect of edge). Hence, products of high reliability cannot be obtained.

The electrolytic solder plating method (solder through-hole method) is known for removing the aforesaid defects of the hole-filling method and obtaining products of high reliability. This method is the same as the hole-filling method up to the copper electroplating step, but differs from the latter in that a resist ink is printed through a negative image. This resist ink is not an etching resist, but is a resist for the electrolytic solder plating to be subsequently carried out. Needless to say, this method does not require the use of the hole-filling ink. As a result of printing the resist ink through the negative, copper is exposed at al circuits and holes required for printed wiring, and those parts which are unwanted for printed wiring are protected with the plating resist ink. The exposed parts are subjected to electrolytic solder plating, and thereafter the plating resist ink printed through the negative is removed. Since the solder has resistance to etching, it acts as an etching resist and protects copper.

Since this method does not use the hole-filling ink, there is no risk of removal of the copper coating in the holes, particularly in the angular parts between the printed circuit and the holes, and it gives products of high reliability.

As an improvement over the electrolytic solder plating method, a method has also been proposed in which a resist ink is printed through a negative on a base board subjected to electroless copper plating, and thereafter, the base board is subjected to electrolytic copper plating and electrolytic solder plating. This method can given products comparable to those obtained by the electrolytic solder plating method. Furthermore, since the resist ink is printed in advance over an area which requires electroless copper plating, it has the advantage of reducing the time and cost over the aforesaid method which involves copper electroplating on all over the surface of the base board.

Thus, the electrolytic solder plating method is excellent in that it can produce a through-hole printed circuit board having high reliability, but has the defect that it requires a longer period of time and larger expenses for production than the hole-filling method. In particular, it has recently been required to provide large amounts of products at low cost within short periods of time. Accordingly, by using the electrolytic solder plating method, it is impossible to meet the consumers' demands fully. Furthermore, according to the electrolytic solder plating method, hydrofluoric acid or lead used may cause pollution, and large expenditures must go into countermeasures against pollution.

It has been strongly desired therefore to develop a process for producing a through-hole printed circuit board having reliability equivalent to, or higher than, that attained by the electrolytic solder plating method, which furthermore is simple in process steps, permits a shortened period of time and a reduced cost of production, and enables simplified treatment of the waste liquor for pollution control.

SUMMARY OF THE INVENTION

The present inventors searched for a substance which is less expensive, safer and easier to remove than solder and which withstand etching and protects copper-plated parts from an etching solution. Since such a substance should form a film selectively on a copper surface alone, the inventors kept an eye on a substance which would form a complex with copper.

Extensive investigations on this basis have led to the discovery that a copper through-hole printed circuit board having the aforesaid desirable properties can be provided by a process which comprises forming a required pattern on a copper-clad laminated plate using a resist ink soluble in an alkaline aqueous solution, immersing the copper-clad laminated plate in an aqueous solution of a salt of an alkylimidazole compound represented by the following general formula

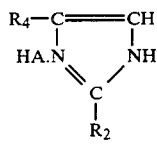

Wherein $R_2$ represents an alkyl group having 5 to 21 carbon atoms, $R_4$ represents a hydrogen atom or a methyl group, and HA represents an organic or inorganic acid, to form on the copper surface of the copper clad laminated plate an etching resist film composed of the alkylimidazole compound, drying the resulting copper-clad laminated plate, and then treating it with an alkaline etching solution.

In other words, the present inventors noted that to produce a copper through-hole printed circuit board having reliability equal to, or higher than, that obtained by the solder through-hole method, it is necessary to find out a substance which can easily give within a short period of time a homogeneous complete etching resist coating on all required parts as is the case with the electrolytic solder plating. Consequently, the inventors have ascertained that a salt of an alkylimidazole compound containing in the molecule both a long hydrophobic group and a polar group having strong affinity for metal is suitable as the substance having the above requirements.

U.S. Pat. No. 3,933,531 to Sawa et al. discloses that the alkylimidazole compound and its salt used in the process of this invention form a chemical coating on a copper-containing surface and exhibits an anticorrosive action on the copper.

DETAILED DESCRIPTION OF THE INVENTION

The alkylimidazole compound used in the process of this invention binds to a metal surface with a strong force, but shows no binding force with respect to general organic compounds. Accordingly, a wide range of resist inks heretofore used can be utilized in this invention as the resist ink printing through a negative which is required before the coating of the alkylimidazole compound in the process of this invention. Of course, an electrically insulating resist ink may also be used. This means that printing of a negative image by a resist ink can also be carried out before electrolytic copper plating.

the essence of the present invention resides in a process for producing a copper through-hole printed circuit board characterized by using a coating of the alkylimidazole compound containing in the molecule both a polar group portion and a long hydrophobic group portion.

The process of this invention, stated more specifically, may roughly include the following two embodiments.

According to a first embodiment of the process of this invention, a base board having a number of required holes is contacted with a catalyst, and then subjected to electroless copper plating followed by copper electroplating. A resist ink is printed through a negative image at parts which do not have to be left as wirings. This resist ink is not an etching resist, but is for the purpose of keeping the metal from contact with the alkylimidazole containing both a polar group and a hydrophobic group to be used in the subsequent step. The base board having the resist ink printed through the negative image is then immersed in an aqueous solution containing a salt of the alkylimidazole compound containing both a polar group and a hydrophobic group to form a coating of the alkylimidazole compound as an etching resist on those parts which are to be left as wirings. The aforesaid resist ink is removed, and thereafter, the base board is subjected to an etching treatment.

A second embodiment of the process of this invention is the same as the first embodiment up to the step of electroless plating. Thereafter, the resist ink is printed through a negative image, and copper electroplating is carried out in the next place. The base board is then immersed in an aqueous solution of the salt of the alkylimidazole compound to form a coating of the alkylimidazole compound as an etching resist. Thereafter, the same steps as in the first embodiment are carried out.

It will be understood from the foregoing description that the steps in the process of this invention up to the printing of the resist ink through the negative may be carried out in the same way as in the known solder through-hole method. Specifically, the base board may be made of a conventional material. It may be a laminated plate copper-clad on both surfaces, or it may be a bare plate not clad with copper foils. When the bare plate is used, the initial electroless copper plating gives a thin copper layer on the surface to permit easy copper electroplating to be performed next. Hence, a copper circuit having a sufficient thickness for printed wiring can be formed. However, the use of a laminated plate copper-clad on both surfaces is generally preferred in view of the adhesion strength between the plate and the copper foil, and therefore of the freedom from delamination.

The electroless copper plating and copper electroplating steps can be carried out in the same way as in the production of conventional through-hole printed circuit boards. As in the sodler through-hole method, those parts which do not have to be left for printed wiring are printed with a resist ink through a negative image so as to prevent the metal from contacting the alkylimidazole compound used in the process of this invention. Printing with a resist ink through a negative image may be carried out after or before electrolytic copper plating. The resist ink used in this invention should be a resist which does not react with the aforesaid alkylimidazole compound. When the printing of the resist ink is carried out before electroless copper plating, the resist ink should have electrical insulation.

The expression "printing of a resist ink", as used in this invention, means not only the usual printing of a resist ink, but also printing by photographic development utilizing a photosensitive resin. The photosensitive resin includes a type which cures upon exposure to decrease in solubility and a type which decomposes upon exposure to increase in solubility. Both types of photosensitive resins can be utilized in this invention. It is possible to use a base board comprising a copper-clad laminated plate to which the photosensitive resin has already been laminated, or to use a copper-clad laminated plate on which an ink of the photosensitive resin is printed on its entire surface, followed by drying.

Examples of the alkylimidazole compound in this invention include 2-amylimidazole (m.p. 38° C.), 2-heptylimidazole (m.p. 45°-46° C.), 2-decylimidazole (m.p. 69°-70° C.), 2-undecylimidazole (m.p. 75°-75.5° CO, 2-dodecylimidazole (m.p. 77°-78° C.), 2-tridecylimidazole (81°-82° C.), 2-tetradecylimidazole (m.p. 83°–84° C.), 2-heptadecylimidazole (m.p. 88°–89° C.), 2-undecyl-4-methylimidazole (m.p. 37°–38° C.), and 2-heptadecyl-4-methylimidazole (m.p. 42°–45° C.). The salts of these imidazoles may be easily formed from these alkylimidazoles and organic or inorganic acids. Examples of the acids include acetic acid, capric acid, glycolic acid, p-nitrobenzoic acid, p-toluenesulfonic acid, picric acid, oxalic acid, succinic acid, maleic acid, fumaric acid, tartaric acid, adipic acid, hydrochloric acid, sulfuric acid, phosphoric acid, lactic acid, oleic acid and phthalic acid.

In a specific embodiment of the process of this invention, the surface of copper is finished by polishing, degreasing and acid pickling, and subsequently immersed in an aqueous solution containing 0.01 to 5%, preferably 0.1 to 2%, of a salt of 2-undecylimidazole or 2-undecyl-4-methylimidazole. the immersion is carried out at a temperature within the range of 0° to 100° C. The suitable immersion time is from several tens of seconds to several tens of minutes. The immersed board is then washed with water and then dried. The suitable pH of the aqueous imidazole salt solution is generally 3.8 to 4.5. The amount of the imidazole adhering to copper increases as the pH of the aqueous solution is higher. Furthermore, the amount of the imidazole adhered to copper increases with increasing treating temperature and increasing treating time.

In the process of this invention, the printed circuit board is immersed in the aqueous solution of the salt of the alkylimidazole compound, but the invention is not to be limited to this specific manner of applying the alkylimidazole salt. It can be carried out by any desired method of contacting. For example, a method may be employed in which the aqueous alkylimidazole salt solution is allowed to flow down along the printed circuit base board. To effect sufficient contacting, it is preferred to vibrate the base board in the aqueous alkylimidazole salt solution, or to stir the solution. Ultrasonication to vibrate the aqueous alkylimidazole salt solution is also an effective means of preventing insufficient coating owing to the adhesion of bubbles to the base board.

One example of the process of this invention is specifically described below. A resist ink capable of being easily dissolved and removed by an aqueous alkaline solution is printed through a negative image as in the solder through-hole method on a printed circuit base board which has been subjected to electroless copper plating and copper electroplating in a customary manner. The ink is then dried, and the base board is immersed for about 1 minute in a weakly acidic aqueous solution of the alkylimidazole salt at a temperature of 30° to 50° C. The base board is then washed with water and dried. The resist ink coated previously is dissolved and removed with a dilute aqueous solution of sodium hydroxide. The board is then washed with water. Thereafter, the unwanted parts of the copper foils of the base board are dissolved and removed by using alkaline etching agents known in the art. As a result, a copper through-hole printed circuit board is obtained. If desired, in order to facilitate the adhesion of a solder resist as a final finish, the board is washed with a dilute aqueous solution of hydrochloric acid whereby the etching resist film can be easily removed substantially from the through-hole circuit board.

The alkylimidazole is insoluble in water at room temperature, but is easy soluble in an acidic aqueous solution.

The alkylimidazole ionized in the acidic aqueous solution shows strong chemical reactivity with copper to form a complex with copper and forms a monomolecular film on the surface of copper. By the van der Waals force of the long-chain alkyl group, the alkylimidazole molecules gather successively on the resulting film and the film becomes firm by the hydrogen bonding force among the imidazole molecules.

Accordingly, when the copper-clad laminated board is immersed in an aqueous solution containing the alkylimidazole salt, a film of the alkylimidazole can be formed on the copper-plated parts inside the holes and those parts on which no resist ink is printed, i.e. on copper in the circuit portion.

Since the alkylimidazole/copper complex constituting the film is insoluble in an aqueous alkaline solution, the copper foils under the imidazole film do not undergo alkali etching. On the other hand, the resist ink film soluble in an aqueous alkaline solution is removed by alkali. Hence, the copper foils in the parts beneath the negative are etched.

The imidazole film remaining unetched should finally be removed for the subsequent solder resist printing or solder coating. This can be achieved easily by using an aqueous solution of an acid.

According to the process of this invention, through-hole printed circuit boards having high reliability can be produced in large quantities within short periods of time. Partly because no expense for pollution control is required, the cost of production is low, and the process is very profitable. Furthermore, wiring in a higher density than by the solder through-hole method is possible. The process is innovative in that for example, it can give a high-density printed circuit board having a circuit at a density of 3 to 4 lines per 2.54 mm.

The following Examples illustrate the present invention more specifically.

EXAMPLE 1

A 1.6 mm-thick FR-4 laminated plate copper-clad on both surfaces (tradename R-1705, a product of Matsushita Denko K.K.) was holed, and subjected to electroless copper plating and subsequent copper electroplating to form a copper coating in a thickness of 25 to 30 microns in the insides of the holes and on both surfaces of the laminate. Then, a coated film of a negative having a thickness of about 20 microns was formed by screen printing using a resist ink containing an alkali-soluble rosin-modified phenolic resin (tradename "F-80LV", a product of Taiyo Ink Mfg., Inc.), and dried at 80° C. for 10 minutes.

The above base board was then immersed in a 5% aqueous hydrochloric acid solution, and then washed with water to clean the copper surface. Thereafter, it was immersed in a 2% aqueous solution of 2-undecylimidazole acetate (pH 4.45) at 50° C. for 3 minutes. The substrate was then withdrawn, washed with water, and dried at 120° C. for 10 minutes.

Subsequently, the resist ink of the negative was dissolved and removed by using a 2% aqueous solution of sodium hydroxide to expose copper at parts which did not have to be left as wirings (the negative area).

Then, the base board was passed for 120 seconds through a spray of an alkaline etching agent (ammonia-ammonium chloride-copper type; specific gravity 1.1–1.2; tradename A Process made by Japan Metal Company) at 50° C. to etch it and produce a copper through-hole printed circuit board.

Thereafter, when the printed circuit board was immersed in a 5% aqueous hydrochloric acid solution, the alkylimidazole coating on the circuit was dissolved and removed.

In this Example, the thickness of the alkylimidazole film was 2.1 microns. The film thickness was measured by an ultraviolet spectrophotometer after the film was removed with a 0.5% aqueous hydrochloric acid solution.

According to this process, the cost of production was 30% less than that required in the production of copper through-hole printed circuit boards by the hole-filling method.

In the prior art, the assembly line operations of filling and removing the hole-filling ink were impossible. But the process of this invention could be adapted to mass production on a conveyor assembly line, and the speed of production increased.

The resulting copper through-hole printed circuit board showed equivalent reliability to that produced by the solder plating peeling method.

When the pH of the alkylimidazole waste liquor is was adjusted to at least 8, the alkylimidazole compound precipitated and could be easily removed by filtration.

EXAMPLE 2

The same copper-clad laminated plate was holed and then subjected to high-speed electroless copper plating to form a copper coating having a thickness of 2 to 3 microns.

The same resist ink as used in Example 1 was applied to the base plate, and then a copper coating was formed on it by electrolytic palting from a copper sulfate bath. The base board was then dried at 120° C. for 5 minutes, washed fully with an aueous solution of ammonium persulfate to clean the copper surface.

The base board was then immersed in the same acidic aqueous alkylimidazole salt solution as used in Example 1, and slowly moved at 50° C. for 3 minutes. Thereafter, the base board was subjected to the same washing, drying, etching ink removal and etching operation as in Example 1 to give a through-hole printed circuit board having equivalent quality to that obtained in Example 1.

EXAMPLE 3

In Example 1, the thickness of the 2-undecylimidazole film was adjusted to 0.3 micron to 3.9 microns, and after washing with water, the base board was dried at 120° C. for 10 minutes.

Films having at thickness of less than 0.3 micron could not withstand etching and were peeled off.

EXAMPLE 4

In Example 1, the base board having formed thereof the 2-undecylimidazole film having a thickness of 1.7 microns was heated for 10 minutes at a temperature of 60°, 80°, 100°, 150°, and 170° C., respectively.

By the heat-treatment at 80° C. or below, the film was not sufficiently hard and could not withstand etching and was peeled off.

When the heating was carried out at 170° C., the imidazole film could not be removed later with a 5% aqueous hydrochloric acid solution. This is presumably because the imidazole film was thermally decomposed at the high temperature.

EXAMPLE 5

When in the procedures of Example 1, a 2% aqueous solution of 2-undecyl-4-methylimidazole acetate (pH 4.40) was used instead of the 2% aqueous solution of 2-undecylimidazole acetate, a film having a thickness of 1.8 microns was obtained after immersion for 3 minutes at 50° C.

The effects of the film thickness and the heating treatment on etching resistance were almost the same as in the case of using 2-undecylimidazole.

EXAMPLE 6

In Example 1, an alkaline etching solution of the ammonia-ammonium chloride-ammonium chlorate type (specific gravity 1.1-1.2; tradename Alkalietch, a product of Yamatoya Co., Ltd.) was used instead of the ammonia-ammonium chloride-copper alkaline etching solution, and the base board was etched by immersing it in the etching-solution at 40° C. for 40 seconds and worked up in the same way as in Example 1. The alkylimidazole film withstand etching.

EXAMPLE 7

A 1.6 mm-thick RF-4 laminated plate copper-clad on both surfaces (tradename R-1705, a product of Matsushita Denko K.K.) was holed, and subjected to electroless copper plating and subsequent electrolytic copper plating to form a copper coating in a thickness of 25 to 30 microns in the insides of the holes and on both surfaces of the laminate.

A coated film of a negative having a thickness of about 20 microns was formed by screen printing using a resist ink comprising an acrylic acid/styrene copolymer as a main component (tradename MA-830, a product of Taiyo Ink Mfg., Co., Ltd.), and dried at 80° C. for 10 minutes.

The base board was immersed in a 5% aqueous solution of hydrochloric acid, washed with water to clean the copper surface, and then immersed in a 2% aqueous solution of 2-undecylimidazole acetate (pH 4.45) at 50° C. for 3 minutes.

The base board was then withdrawn, washed with water, and dried at 140° C. for 15 minutes. Subsequently, the negative resist ink was dissolved and removed with a 5% aqueous solution of sodium hydroxide, and copper was exposed at those parts which did not have to be left as wirings (negative image area).

Thereafter, the base board was passed for 120 seconds through a spray at 50° C. of an alkaline etching agent (ammonia-ammonium chloride-copper type; specific gravity 1.1-1.2; tradename A Process, made by Japan Metal) for etching to produce a copper through-hole printed circuit board.

When the circuit board was then immersed in a 5% aqueous hydrochloric acid solution, the alkylimidazole film on the circuit was dissovled and removed.

The thickness of the alkylimidazole film in this Example was 2.1 microns.

The resulting copper through-hole printed circuit board showed equivalent reliability to that produced by the solder plating peeling method. The operability during the production was the same as in Example 1.

What is claimed is:

1. A process for producing a copper through-hole printed circuit board, which comprises forming a required pattern on a copper-clad laminated plate using a resist ink soluble in an alkaline aqueous solution, immersing the copper-clad laminated plate in an aqueous solution of a salt of an alkylimidazole compound represented by the following general formula

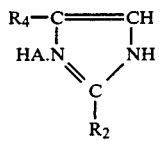

wherein $R_2$ represents an alkyl group having 5 to 21 carbon atoms, $R_4$ represents a hydrogen atom or a methyl group, and HA represents an organic or inorganic acid, to form on the copper surface of the copper-clad laminated plate an etching resist film composed of the alkylimidazole compound, drying the resulting copper-clad laminated plate, and then treating it with an alkaline etching solution.

2. The process of claim 1 wherein the alkylimidazole compound is 2-undecylimidazole.

3. The process of claim 1 wherein the alkylimidazole compound is 2-undecyl-4-methylimidazole.

* * * * *